United States Patent [19]
Noltemeyer et al.

[11] Patent Number: 6,014,091
[45] Date of Patent: Jan. 11, 2000

[54] SENSOR DEVICE, ESPECIALLY A HALL SENSOR, WITH A BINARY OUTPUT AND A FAULT DETECTION CIRCUIT

[75] Inventors: Ralf Noltemeyer, Wernau; Horst Fuhrmann, Ludwigsburg, both of Germany

[73] Assignee: Robert Bosch GmbH, Stuttgart, Germany

[21] Appl. No.: 08/887,214

[22] PCT Filed: Sep. 24, 1996

[86] PCT No.: PCT/DE96/01805

§ 371 Date: Jul. 2, 1997

§ 102(e) Date: Jul. 2, 1997

[87] PCT Pub. No.: WO97/18479

PCT Pub. Date: May 22, 1997

[30] Foreign Application Priority Data

Nov. 11, 1995 [DE] Germany .......................... 195 42 086

[51] Int. Cl.⁷ ...................................................... H03M 1/22
[52] U.S. Cl. .............................. 341/7; 341/15; 341/207.12; 341/207.2; 341/225
[58] Field of Search .................... 341/7, 15; 324/207.12, 324/207.2, 225

[56] References Cited

PUBLICATIONS

R. Schiefer/Integrierte Hall–Effekt–Sensoren/pp. 29–31/1995.

*Primary Examiner*—Michael Tokar
*Assistant Examiner*—Jason L W Kost
*Attorney, Agent, or Firm*—Michael J. Striker

[57] ABSTRACT

A device for detecting faults including sensor failure in a sensor that outputs a substantially binary output signal is described. For fault detection, the various terminals of the sensor are supplied with substantially binary voltages from a fault detection circuit and the changes in the output signal of the sensor that occur as a consequence of the supplied voltages are evaluated for fault detection.

6 Claims, 1 Drawing Sheet

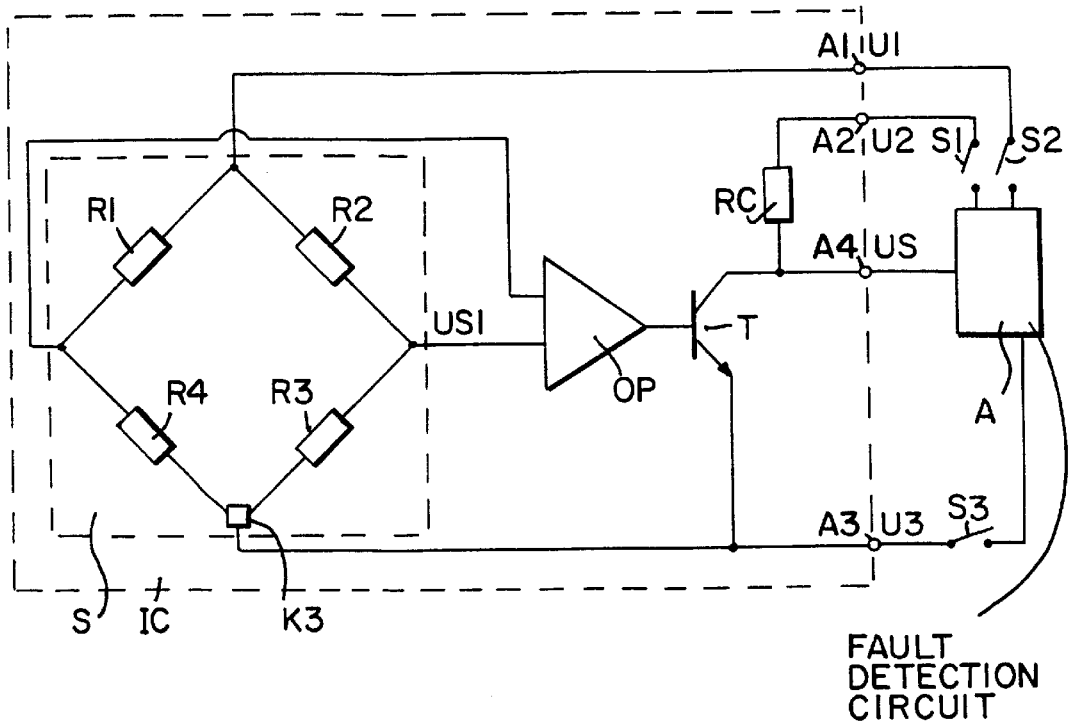
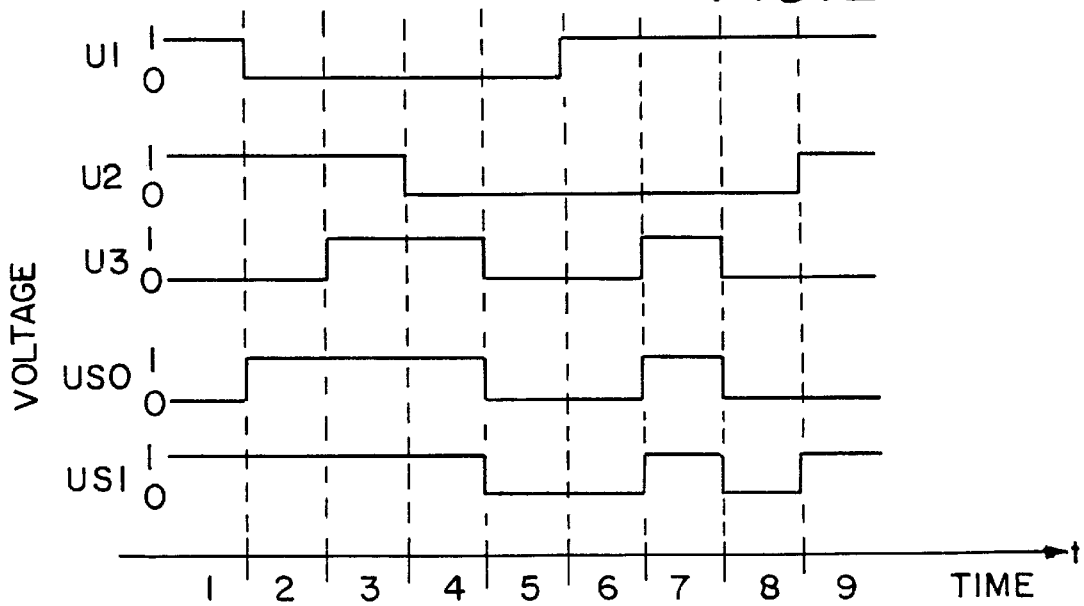

SENSOR DEVICE, ESPECIALLY A HALL SENSOR, WITH A BINARY OUTPUT AND A FAULT DETECTION CIRCUIT

BACKGROUND OF THE INVENTION

1. Field of the Invention

The present invention relates to a sensor device having a binary output signal, and, more particularly, to a sensor device including a sensor element, especially a Hall sensor element, output signal preparation means, terminals for voltage supply, for a prepared output signal and for connection to ground and a circuit device for detecting faults in the sensor.

2. Prior Art

For determining the location of a component or an angular position, sensors are used whose output signal can assume essentially two states, namely one state in which the signal is "high" and one state in which it is "low".

Such sensors are Hall sensors or Hall switches, for instance, which scan movable parts on whose surface characteristic magnetic structures, for instance, are located. Depending on whether a north pole or a south pole is facing the Hall element, the output signal of the sensor is "high" or "low".

The design and mode of operation of integrated Hall effect sensors is described for instance in the journal Electronic Industry 7-1955. Printed in this journal is an article by P. Schieffer entitled "Integrierte Hall-Effekt-Sensoren zur Positions- und Drehzahlerkennung" [Integrated Hall Effect Sensors for Position and RPM Detection], which among other things describes how a Hall sensor switches over on the approach of a south pole of a magnet. The design of this Hall sensor is such that a chip that carries the Hall IC is connected to supply voltage by a first terminal and to ground via a resistor by a second terminal. The output signal of the Hall sensor can be picked up at this second terminal. A further input of the Hall IC is connected to supply voltage as well, via a further resistor. This input leads to a transistor, which is a component of the IC and acts as a so-called open-collector output stage.

On the aforementioned approach of a south pole of a magnet, the signal of the Hall sensor exceeds a turn-on threshold, and the open-collector output is made conducting; the signal present at the output of the Hall IC assumes a "low" state. If the magnet is moved away from the IC again, then the magnetic field corresponding to the output threshold is undershot, the open-collector output resumes high resistance, and the output signal of the Hall sensor changes to the "high" state.

With such Hall sensors, it is possible to detect not only north or south poles but also to detect a ferromagnetic baffle, for instance, that extends between the Hall IC and an opposed magnet. In general, such Hall effect sensors can be used in many possible applications. One example for the use of a plurality of Hall effect sensors is also disclosed in International Patent Application PCT/DE 95/00343. The embodiment described there shows how the steering angle of a motor vehicle is ascertained using a number of Hall sensors. This known system for steering angle detection comprises a precision system with a disk that has recesses within a track on its circumference. This rotatable disk is scanned with the aid of a plurality of Hall sensors, disposed at equal angular intervals, and by the cooperation of the disk and sensors a signal is produced that reproduces a code, which allows an absolute value detection within one steering wheel revolution. The disk is made for instance of sheet metal that is magnetically highly conductive, and it is permanently connected to the steering shaft. The recesses in the disk that rotates with the steering shaft are scanned with the aid of nine magnet-Hall-gates, disposed on the circumference of the disk. These Hall gates are a component of a Hall sensor at whose output a logical 1 ("high") is produced whenever there is no sheet metal between the magnet and the Hall gate, and a logical 0 ("low") is produced when a magnetic flux through a sheet-metal segment of the disk is interrupted.

Since in such a system, a univalent code is obtained for every angular position within 360°, a statement can be made about the angular position immediately after turn-on, as long as it is assured that all the Hall sensors are functioning properly. If a coarse system is used, with an encoded disk that rotates with a stepdown of 1:4 by means of a gear and is scanned with associated sensors, then the detectable angular range can be expanded to 7200°.

If the steering wheel angle sensor known from PCT/DE 95/00343 is to be used in conjunction with a driving dynamics control system, then intrinsic safety is required. This requirement means that all the Hall sensors of the system must either function reliably, or that any failure of a sensor can be detected as fast and reliably as possible.

SUMMARY OF THE INVENTION

It is an object of the present invention to provide an improved sensor device which does not suffer from the above-described disadvantages and which can be safely and reliably used immediately after being turned on.

This object and others which will be made more apparent hereinafter are attained in a sensor device with fault detection means, which comprises an integrated circuit including a first terminal, a second terminal, a third terminal, a fourth terminal, a sensor element, especially a Hall sensor element, comprising means for generating a binary output signal and connected with the first terminal to receive a supply voltage and a signal preparation means for preparing the binary output signal, which includes at least one operational amplifier for amplifying the binary output signal to produce an amplified output signal and a transistor having a base, a collector and a source, the base being connected with the at least one operational amplifier to receive the amplified output signal therefrom and the collector being connected to the fourth terminal at which a processed signal voltage is detected and to the second terminal via a resistor; and a fault-detection circuit means including means for applying a plurality of respective input voltages to the first, second and third terminals of the integrated circuit and means for analyzing a response of the processed signal voltage to the respective input voltages at the fourth terminal.

The device according to the invention for detecting errors in a sensor has the advantage that a failure of the sensor is detected safely and reliably immediately after turn-on, thus preventing further processing of any defective output signal. This advantage is attained by carrying the open-collector output of the Hall sensor or Hall sensors to the outside as an additional terminal, so that a Hall sensor is obtained that has one supply voltage terminal, one terminal to the open collector, as well as a ground terminal and a separate terminal for picking up the signal voltage. The first three terminals are then supplied with supply voltage, modulated in a suitable way, the supply voltage in each case having either the "high" state or the "low" state. Depending on the switching state of the output signal, or in other words on whether the Hall element is facing a magnet or a baffle or a gap, the output signal can be checked for line breakage and short-circuiting. In the final analysis, what is checked is whether upon a temporary modulation of the three supply voltages, the signal voltage is performing in the expected way or not. If not, a malfunction is found.

BRIEF DESCRIPTION OF THE DRAWING

One exemplary embodiment of the invention is shown in the drawing and will be described in further detail in the ensuing description.

FIG. 1 is a block diagram of one embodiment of a sensor, for instance a Hall element, including the associated fault evaluation circuit according to the invention.

FIG. 2 is a graphical illustration of the behavior of the supply voltage modulations and the signal voltages occuring during tests of the sensor with the fault evaluation circuit according to the invention.

DESCRIPTION OF THE PREFERRED EMBODIMENT

FIG. 1 shows an example of a sensor whose design makes the error detection according to the invention possible. The sensor element S comprises a bridge circuit of four resistors R1, R2, R3, R4. The sensor element S has a terminal Al, by way of which the supply voltage is typically supplied. A further terminal A3 of the sensor element leads to a clamp K3, by way of which clamp the voltage U3 can be supplied. A further terminal of the sensor element S, at which the signal voltage US1 can be picked up, leads to an operational amplifier, in which the signal voltage US1 furnished by the sensor element is suitably prepared and amplified OP. The output signal of the operational amplifier is typically already a binary signal, which is either "high" or "low". This signal is carried to the base of the transistor T, which together with the resistor RC forms the open-collector output of the evaluation circuit. The wiring of the transistor is such that the emitter is connected to the terminal A3, and the collector leads directly to a terminal A4, at which the prepared signal voltage US can be picked up. The collector of the transistor T is also carried to the terminal A2 via the resistor RC. The arrangement described is for instance integrated into an integrated circuit IC.

With the circuit arrangement shown in FIG. 1, error detection can be done, for instance the detection of a line break or a short circuit. To that end, the voltages U1, U2, U3 located at the terminals A1, A2, A3 are supplied to the evaluation device A, and the voltage delivery can be interrupted in a selectable way via switch means S1, S2 and S3. One possible course of the voltages U1, U2, U3 in the evaluation device A over time is shown in FIG. 2. Besides the delivered voltages U1, U2, U3, FIG. 2 also shows the output voltages $US=US_0$ and $US=US_1$ over the time t. $US_0$ is the course of voltage at the output terminal A4 of the Hall sensor in the switching state o, while $US_1$ is the voltage at the output terminal A4 in the switching state 1, or in other words the state in which no magnet or ferromagnetic material is associated with the sensor element S.

The evaluation of the course of the voltage US at the terminal A4 is done in an evaluation device A connected to the output side. This may be a simple voltage meter, or the evaluation device A may be a microcontroller or the control unit of an internal combustion engine. In each case, checks are run in the evaluation device A as to whether the voltages $US=US_0$ or $US=US_1$ are behaving in the way plotted in FIG. 2, as long as the voltage modulations, also plotted in FIG. 2, are carried out by opening or closing the switch means S1, S2, S3. The following will briefly sketch why the voltage courses must behave as shown in FIG. 2:

In the time period marked 1, the voltages U1 and U2 are high (1) and the voltage U3 is low (0). If the sensor element is in the switching state 0, then the voltage US at the terminal A4 is low (0), given correct functioning. Conversely, if the sensor element is in the switching state 1, then the voltage US must be "high" (1) at the output terminal A4. In the time period 1, the typical voltage supply is shown. The supply voltage for the sensor element S is equal to U1 and the voltage at the open collector is accordingly "high" and the voltage at the terminal A3 is equal to 0, so that the sensor must output the expected signal 0 or 1, depending on the switching state.

In time period 2, the actual supply voltage U1 is turned off, while the voltages U2 and U3 remain unchanged compared with time period 1. In this case, the terminal A4 is at a voltage level that is "high" (1), because the transistor T is blocking, and the voltage U2 reaches the terminal A4 via the resistor RC. In the switching state 1, a voltage level "high" is present both at the base of the transistor T and at the collector of the transistor T, so that voltage at "high" is also present at the terminal A4.

In the time period 3, a voltage that is "high" (1) is supplied to the terminal A3. Since U1 is "low" and U2 is "high", the voltage US at the output terminal A4 must be "high", regardless of whether the switching state is 0 or 1.

In the other time periods 5, 6, 7, 8, at the transition from one period to the next, once again one of the voltages U1, U2, U3 is changed, or in other words switched from "high" to "low" or vice versa. The changes shown under $US_0$ and $US_1$ must then result. If at least one of the expected changes in the voltages $US_O$ or $US_1$ does not occur, then an error is detected.

The period 9 again corresponds to the period 1. No later than when the eight time periods from 1 to 9 have been run through, then one of the expected signal changes for $US_0$ or $US_1$ must not have occurred if any error has occurred. Conversely, if all the signal changes of $US_0$ or $US_1$ have in fact occurred, then it is assured that no error is present.

The temporary modulation shown in FIG. 1 for the supply voltages U1, U2, U3 can be performed for instance each time the sensor is newly put into operation. It is also possible to carry out such a temporary voltage modulation for error detection purposes after predeterminable periods of time or lengths of time in operation. Each time the test sequences are performed with voltage modulation, a new error detection operation can be performed.

The proposed error detection is usable particularly in conjunction with Hall elements, but is also usable in combination with other sensors that furnish a substantially binary output signal; what is essential is that the sensors to be monitored have a plurality of terminals by way of which temporary modulations in the supplied voltages can be made.

The proposed device for error detection in a sensor can be used for instance in a steering angle sensor, of the kind known from International Patent Application PCT/DE 95/00343. In that case, the sensors (such as Hall sensors) of both the precision system and the coarse system can then be monitored; the sensors can then again be operated in the open-collector mode. An error in a sensor can thus be detected immediately.

We claim:

1. A sensor device with fault detection means, said sensor device comprising an integrated circuit (IC) including a first terminal (A1), a second terminal (A2), a third terminal (A3), a fourth terminal (A4), a sensor element (S) comprising means for generating a binary output signal and connected with said first terminal to receive a supply voltage and a signal preparation means for preparing said binary output signal, said signal preparation means including at least one operational amplifier (OP) for amplifying said binary output signal from said sensor element (S) to produce an amplified output signal and a transistor (T) having a base, a collector and a source, said base of said transistor being connected with said at least one operational amplifier to receive said amplified output signal therefrom and said collector being directly connected to said fourth terminal (A4) at which a processed signal voltage (US) is detected and said collector being connected to said second terminal (A2) of said integrated circuit (IC) via a resistor (RC); and a fault detection circuit means (A) including means for applying a plurality of respective input voltages (U1, U2,U3) to said first, second and third terminals of said integrated circuit and means for analyzing a change of said processed signal voltage (US) at said fourth terminal (A4) in response to said respective input voltages.

2. The sensor device with fault detection means as defined in claim 1, wherein said means for applying said respective input voltages is formed so that said respective input voltages are each in a high state or a low state, a course of said input voltages is subdivided into a plurality of time periods and switching between said high state and said low state occurs only when one of said time periods expires and another of said time periods begins.

3. The sensor device with fault detection means as defined in claim 2, wherein said input voltages are periodic and repeat after eight of said time periods.

4. The sensor device with fault detection means as defined in claim 1, wherein said sensor element is a Hall sensor element.

5. A sensing apparatus comprising a plurality of said sensor devices as defined in claim 1, and means for temporary modulation of said input voltages (U1,U2,U3) of each of said sensor devices either simultaneously or in a chronologically staggered manner.

6. A steering angle sensing apparatus for a motor vehicle, said motor vehicle including a steering shaft and means for steering said motor vehicle responsive to said steering shaft, and said steering angle sensing apparatus comprising a plurality of encoded disks, said encoded disks being permanently connected to said steering shaft and each having a respective structure including a code characteristic of an angular position of said steering shaft, and a sensor device associated with each of said encoded disk for detecting said structure including said code, wherein said sensor device comprises an integrated circuit (IC) including a first terminal (A1), a second terminal (A2), a third terminal (A3), a fourth terminal (A4), a Hall sensor element comprising means for generating a binary output signal and connected with said first terminal to receive a supply voltage and a signal preparation means for preparing said binary output signal, said signal preparation means including at least one operational amplifier (OP) for amplifying said binary output signal from said Hall sensor element to produce an amplified output signal and a transistor (T) having a base, a collector and a source, said base of said transistor being connected with said at least one operational amplifier to receive said amplified output signal therefrom and said collector being connected to said fourth terminal (A4) at which a processed signal voltage (US) is detected and said collector being connected to said second terminal (A2) of said integrated circuit (IC) via a resistor (RC); and a fault-detection circuit means (A) including means for applying a plurality of respective input voltages (U1,U2,U3) to said first, second and third terminals of said integrated circuit and means for analyzing changes in said processed signal voltage (US) at said fourth terminal (A4) in response to said respective input voltages.

* * * * *